Figure 1:
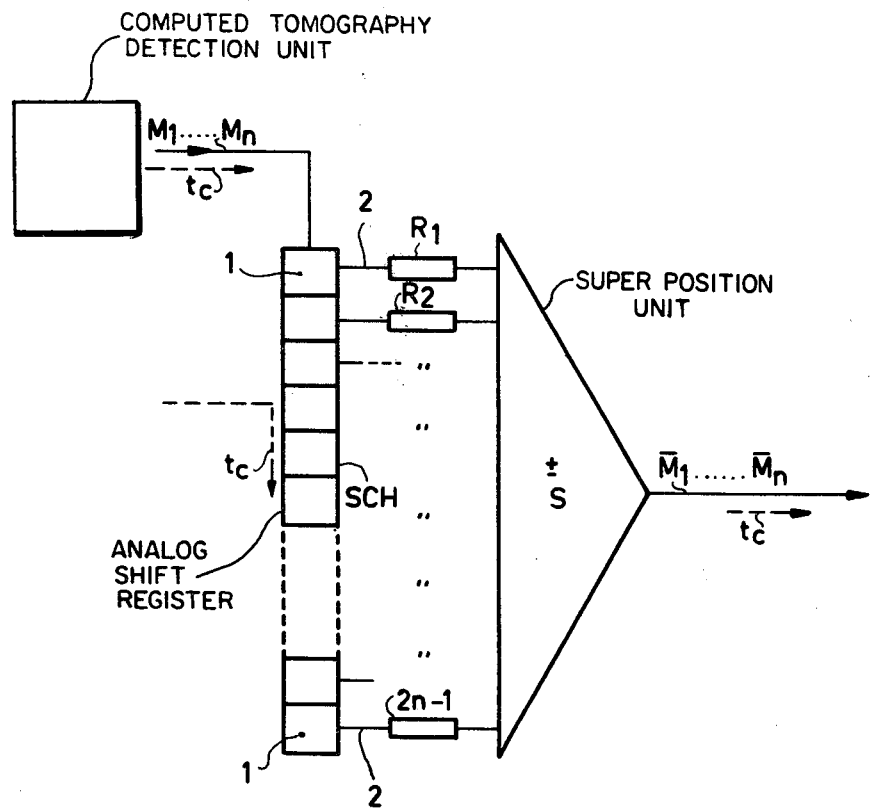

United States Patent [19]

Kowalski

[11] 4,149,259
[45] Apr. 10, 1979

[54] TRANSVERSAL FILTER FOR CONVOLUTED IMAGE RECONSTRUCTION

[75] Inventor: Gunter Kowalski, Hamburg, Fed. Rep. of Germany

[73] Assignee: U.S. Philips Corporation, New York, N.Y.

[21] Appl. No.: 905,378

[22] Filed: May 12, 1978

Related U.S. Application Data

[63] Continuation of Ser. No. 685,499, May 12, 1976, abandoned.

[30] Foreign Application Priority Data

May 16, 1975 [DE] Fed. Rep. of Germany ....... 2521796

[51] Int. Cl.² ........................ G06F 15/34; H03K 7/00; G01T 1/161
[52] U.S. Cl. ................................ 364/724; 250/445 R; 364/414; 364/572; 364/825
[58] Field of Search ............... 364/724, 728, 414, 527, 364/572, 604, 819, 824, 825; 250/272, 308, 510, 550, 362, 369, 445 R, 445 T; 340/347 AD, 347 R; 333/28 R, 29, 28 T; 328/37, 142

[56] References Cited

U.S. PATENT DOCUMENTS

| 2,922,965 | 1/1960 | Harrison ............................ 333/28 R |
| 3,303,335 | 2/1967 | Pryor ..................................... 364/724 |
| 3,314,015 | 4/1967 | Simone .................................. 328/165 |
| 3,521,170 | 7/1970 | Leuthold et al. ..................... 328/142 |
| 3,543,009 | 11/1970 | Voelcker, Jr. ........................ 364/724 |
| 3,670,151 | 6/1972 | Lindsay et al. ......................... 333/29 |
| 3,924,129 | 12/1975 | Lemay .................................. 250/362 |
| 3,936,636 | 2/1976 | Percival ................................ 250/369 |

Primary Examiner—Charles E. Atkinson
Assistant Examiner—Errol A. Krass
Attorney, Agent, or Firm—Thomas A. Briody; Jack E. Haken

[57] ABSTRACT

A device for reconstruction of the absorption values in a layer of a body from measured values taken along strips in the body is disclosed. The absorption values are obtained from the measured values by an analog or a digital device, using a transversal filter in which the measured values are assigned weighting factors in accordance with predetermined criterion.

5 Claims, 2 Drawing Figures

TRANSVERSAL FILTER FOR CONVOLUTED IMAGE RECONSTRUCTION

This is a continuation, of application Ser. No. 685,499, filed May 12, 1976, now abandoned.

The invention relates to a device for measuring the spatial distribution of the radiation absorption or emission in a layer of a body. The absorption or the emission of the body is measured in a large plurality of directions in the plane of the layer in a plurality of measured series. Each such measuring series involving a number of measured values of the absorption or the emission along strips which extend at least approximately parallel relative to each other. The measured values are obtained by applying a convolution transform to the measurements.

A device of this kind is known, for example, from German Offenlegungsschrift Nos. 1,941,433 and 2,417,317, and corresponding U.S. Pat. Nos. 3,778,614 and 3,936,636, herein incorporated by reference. Such references disclose the known computed tomography detection units for deriving measurements taken along strips in a body approximately parallel to each other, and producing a time-sequence of analog signals corresponding thereto. The convolution transform construction of measured values offers the advantage that the absorption or the emission can be comparatively readily defined at individual points or areas in a region covered by the measurement, even though the measured values per se are not a measure for the absorption or emission in individual points, but rather a measure for the absorption along a strip through a layer to be examined which is passed during the measurement. The "convoluted" values merely have to be "spread" along the strip along which the measured value assigned to the convoluted value has been recorded. This means that the convoluted value is assigned to all points of the layer to be examined which are situated in this strip. This "spreading" operation is performed for each measured value of each measured series, and the convoluted values of different measured series are superposed, because the strips along which the absorption is measured intersect in the individual measured series. The value resulting from the superposition is a measure for the absorption or the emission in the relevant point or region of the layer to be examined.

A device comprising different shift registers, one containing measured values of a measured series, while the other register containing the weighting factors to be used, has been proposed for performing the convolution. Values present in the shift registers are successively shifted to the output of the shift register and are electronically multiplied. Multiplier circuits of this kind are comparatively inaccurate in the case of analog signals; however, in the case of measured values in digital form, they are expensive and comparatively slow.

The invention has for its object to provide a device of the kind set forth by means of which, using simple means, convolution operations can be performed with a suitable accuracy and at a high speed. To this end, a device of the kind set forth according to the invention is characterized in that the measured values of a measured series are each time applied in series to a transversal filter, the values subjected to the convolution process being available on the output of the said filter.

The source of the analog signals or measured values $M_1, \ldots M_n$ is illustrated in the Figure as a Computed Tomography Detector Unit, which is disclosed in the U.S. Pat. Nos. 3,778,614 and 3,936,636 incorporated by reference above.

The transversal filters used for this purpose are utilized, for example, in the communication technique, for replacing the filtering in the frequency spectrum by time-dependent processing. The latter necessitates the use of a delay line comprising numerous discrete branches. In order to achieve a delay of this kind, clock-controlled shift registers can be effectively used. Some preferred embodiments of the device in accordance with the invention will be described in detail hereinafter.

Figure 2:
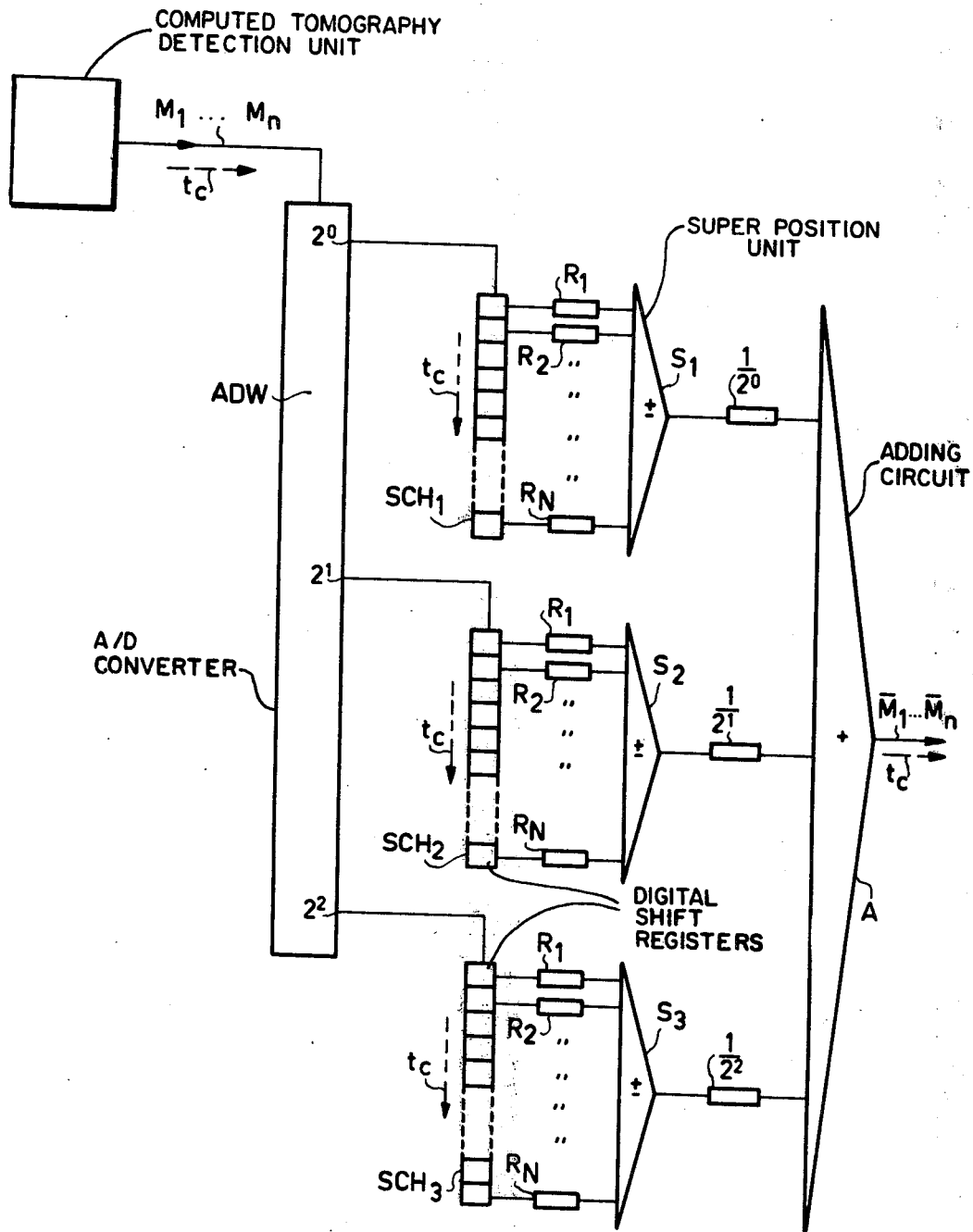

FIG. 1 shows a circuit arrangement comprising a transversal filter comprising a shift register, and FIG. 2 shows a circuit arrangement comprising digital shift registers and analog circuits for generating weighting factors.

In a circuit arrangement as shown in FIG. 1, measured values $M_1 \ldots M_n$ are applied in series to an analog shift register SCH. For a measurement involving n measured values per measured series, this shift register comprises $2n-1$ register cells 1. The branches 2 of the individual register cells are connected to resistors $R_1$, $R_2$, $R_{2n-1}$ for applying weighting factors to the measured values. The resistors are connected on the other side to a superposition unit S, for example, a feed-back operational amplifier. The superposition unit comprises inputs which can operate in a non-inverting as well as an inverting manner, so that positive as well as negative weighting factors can be introduced.

The operation of the device is as follows. The measured values $M_1 \ldots M_n$ of a measure series produced in a computed tomography detection unit, which may for example be one of the units described in the above-cited references are controlled by a clock signal $t_c$ which is applied in series to the shift register SCH in which it is written. When all measured values have been written in, the measuring value $M_n$ being stored in the last register cell which is connected to the superposition unit S via the resistor $R_1$, a value $\overline{M}_1$, assigned to the measured value $M_1$ first written in the shift register, appears on the output of the superposition unit S. In response to each subsequent clock pulse, all subsequent measured values are shifted one cell towards the output. A convoluted value $\overline{M}_2$, assigned to the measured value $M_2$, than appears on the output of the superposition unit S. This operation is repeated until the measured value $M_1$ is in the last register cell and the measured value $M_n$ is in the central register cell, the convoluted value $\overline{M}_n$ assigned to the measured value $M_n$ then being formed.

The values of the resistors between the cells of the shift register and the superposition unit determining the weighting factors for the measured values present in the cells. The resistor values are symmetrically distributed, i.e. the resistor $R_1$ corresponds to the resistor $R_{2n-1}$, the resistor $R_2$ to the resistor $R_{2n-2}$ which is connected to the last register cell but one, etc. It is thus achieved that, for example, the measured value $M_n$ becomes effective with the same weight for the formation of the convoluted value $\overline{M}_1$ as the measured value $M_1$ for the formation of the convoluted value $\overline{M}_n$. Generally, the resistors connected to the central register cells are lower in value than the resistors connected to the outer register cells. It is thus achieved that the measured values recorded along strips which are situated in the vicinity of the strip in which the measured value has been recorded have more effect than the other values. If the weighting resistors of the outer weightings exceed a limit value, i.e. if the values weighted thereby become negligibly small, they can also be completely omitted and the number of register cells of the shift register can be reduced accordingly.

Digital shift registers can have a substantially simpler construction than analog shift registers required for the embodiment shown in FIG. 1. However, the weighting, possibly by digital multiplier circuits, is then substantially more expensive.

FIG. 2 shows a circuit arrangement for an embodiment in accordance with the invention in which digital shift registers are used but in which the application of the weighting factors is effected in an analog manner. The measured values $M_1 \ldots M_n$ are converted into a binary number by an analog-to-digital converter ADW.

The source of the analog signals or measured values $M_1, \ldots M_n$ is illustrated in the Figure as a Computed Tomography Detector Unit, which is disclosed in the U.S. Pat. Nos. 3,778,614 and 3,936,636 incorporated by reference above. Each bit of this number (in FIG. 2 a conversion of a binary number comprising only three bits is assumed) is applied, in dependence of its position in the binary number, to one of the three digital shift registers $SCH_1 \ldots SCH_3$ which are controlled by the same clock signal $t_c$ as used for fetching the measured values $M_1, \ldots M_n$. Each bit, either a 0 or a 1, is separately weighted, the logical potentials being treated as analog signals. This enables a simple weighting by the resistors $R_1, R_2 \ldots R_{2n-1}$ and subsequent superposition units $S_1 \ldots S_3$. For negative weightings, these would again have to include an inverting input. Since each bit has a different valence in accordance with its position in the binary number, the output signals of the superposition units $S_1 \ldots S_3$ are weighted a second time by resistors in accordance with the valence of the relevant bit (i.e. in the ratios $1:\frac{1}{2}:\frac{1}{4} \ldots$ etc.), are subsequently added in an adding circuit A and are possibly converted into a digital signal by a second analog-to-digital converter. The shift registers can again be reduced if the weighting factors of the outer cells become so small that their contribution can be neglected.

Double weighting can be avoided by coupling the second weighting operations to the first weighting operations, so that the valence of the relevant bit is already taken into account during the first weighting operation. In that case only one superposition unit is required; however, the resistors are not group-wise identical, as in the embodiment shown in FIG. 2, in such a case.

What is claimed is:

1. A signal processing device comprising:
    means for supplying a time-sequence of n analog signals; and
    transversal filter means which function to perform a convolution on said sequence of signals including:
    an analog shift register having a serial input connected to said means for supplying and $2n-1$ parallel outputs;
    $2n-1$ resistors, each having first and second terminals, the first terminal of each one of said resistors being connected to a corresponding one of said parallel outputs, the value of a k th resistor being equal to the value of a $2n-k$ th resistor, for $k=1, 2, \ldots (2n-1)$, and
    superposition means having inputs connected to said second terminals of said plurality of resistors which function to form a superposition of the signals on said inputs.

2. A device as claimed in claim 1, wherein said superposition means comprises an operational amplifier.

3. A transversal filter for processing a time sequence of digital signals which are presented as a plurality of signal inputs each corresponding to a different significant digit of said signals in said sequence, comprising:
    a plurality of digital shift registers, an input of each of said shift registers being connected to a corresponding one of said signal inputs each of said shift registers having a plurality of outputs;
    convolving means having inputs connected to said outputs of said shift registers which function to produce a convolution transform of said sequence of signals said convolving means including a plurality of first resistors each having first and second terminals, the first terminal of each of said resistors being connected to a corresponding output of said shift registers;
    a plurality of superposition units, each of said superposition units having inputs connected to said respective second terminals of ones of said resistors associated with the corresponding outputs of one of said shift registers; and
    a plurality of second resistors, each connected between the output of a corresponding one of said superposition units and an input of adding means, the value of each of the resistors being inversely proportional to $2^k$, where k is a non-negative integer which represents the position of the associated digit in said digital signals.

4. In a computed tomography system, the combination comprising:
    computed tomography detection means which function to take measurements along strips which are oriented approximately parallel to each other in a plane through a body and to produce a time-sequence of analog signals corresponding thereto; and
    transversal filter means which function to perform a convolution on said sequence of signals, having an input connected to said detection means and an output on which a corresponding sequence of convoluted signals is produced, said filter means including: an analog shift register having a serial input connected to said detection means and a plurality of parallel outputs; and superposition means which are connected to said parallel outputs of said analog shift register and which function to form a superposition of the signals on said outputs.

5. In a computed tomography system, the combination comprising:
    computed tomography detection means which function to take measurements along strips which are approximately parallel to each other in a plane through a body and to produce a time-sequence of digital representations thereof at a plurality of outputs, each output corresponding to a different significant digit of said digital representations; and
    transversal filter means including:
    a plurality of digital shift registers, each of said shift registers being connected to a corresponding one of said outputs of said detection means;
    convolving means having inputs connected to said shift registers which function to perform a convolution on said sequence of signals, said convolving means comprising a plurality of resistors having first and second terminals, the first terminal of each of said resistors being connected to a corresponding output of said shift register; a plurality of superposition units, each of said superposition units having inputs connected to said second terminals of ones of said resistors and adding means which function to sum outputs of said superposition units.

* * * * *